(12) United States Patent
Kishiro (10) Patent No.: US 9,696,338 B2
(45) Date of Patent: Jul. 4, 2017

(54) CAPACITANCE DETECTION CIRCUIT (71) Applicant: FUJI ELECTRIC CO., LTD., Kawasaki-shi (JP)

(72) Inventor: Masami Kishiro, Hino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 462 days.

(21) Appl. No.: 14/350,807

(22) PCT Filed: Nov. 12, 2012

(86) PCT No.: PCT/JP2012/007256
§ 371 (c)(1),
(2) Date: Apr. 9, 2014

(87) PCT Pub. No.: WO2013/073161
PCT Pub. Date: May 23, 2013

(65) Prior Publication Data
US 2014/0238133 A1    Aug. 28, 2014

(30) Foreign Application Priority Data

Nov. 15, 2011  (JP) ................................. 2011-249980

(51) Int. Cl.
*G01P 15/18*    (2013.01)
*G01P 15/125*   (2006.01)
(Continued)

(52) U.S. Cl.
CPC .............. *G01P 15/125* (2013.01); *G01L 9/12* (2013.01); *G01P 15/18* (2013.01); *G01P 2015/084* (2013.01); *G01R 27/2605* (2013.01)

(58) Field of Classification Search
CPC ..................................................... G01P 15/125
See application file for complete search history.

(56) References Cited

U.S. PATENT DOCUMENTS 5,481,914 A * 1/1996 Ward ...................... H03F 1/083
                                                        73/504.16
5,576,976 A * 11/1996 White .................. H03H 17/025
                                                         333/17.1
(Continued)

FOREIGN PATENT DOCUMENTS

EP         0715153 A1    6/1996
JP       H05-231973 A    9/1993
(Continued)

OTHER PUBLICATIONS

Machine translated JP 2011-107086.*

*Primary Examiner* — Paul West
*Assistant Examiner* — Mark A Shabman
(74) *Attorney, Agent, or Firm* — Rabin & Berdo, P.C.

(57) ABSTRACT

A capacitance detection circuit inhibits noise. The capacitance detection circuit detects a change in capacitance between a pair of electrodes of a physical quantity sensor, with these electrodes generating the change in capacitance in response to a change in physical quantity. The capacitance detection circuit has a carrier signal generating circuit that supplies a carrier signal to one of the electrodes, an operational amplifier that has an inverting input terminal to which the other one of the electrodes is input, a dummy capacity that is connected in parallel to the pair of electrodes, and a carrier signal conditioning circuit that inverts a phase of a carrier signal supplied from the carrier signal generating circuit to the dummy capacity and adjusts a gain to inhibit the dummy capacity.

10 Claims, 7 Drawing Sheets

(51) Int. Cl.
*G01L 9/12* (2006.01)
*G01R 27/26* (2006.01)
*G01P 15/08* (2006.01)

(56) References Cited

U.S. PATENT DOCUMENTS

| | | | |
|---|---|---|---|
| 5,703,292 A * | 12/1997 | Ward | H03F 1/083 73/504.02 |
| 5,707,077 A * | 1/1998 | Yokota | G01P 15/125 280/735 |
| 5,726,579 A | 3/1998 | Masuda | |
| 5,969,225 A * | 10/1999 | Kobayashi | G01C 19/5719 73/1.37 |
| 7,096,732 B2 * | 8/2006 | Katsumata | G01C 19/5719 257/414 |
| 8,096,180 B2 * | 1/2012 | Yamanaka | G01C 19/5726 73/504.12 |
| 2005/0030679 A1 | 2/2005 | Yakabe | |
| 2007/0144256 A1 * | 6/2007 | Mori | G01C 19/5776 73/504.12 |
| 2008/0022762 A1 * | 1/2008 | Skurnik | B60C 23/0408 73/146.5 |
| 2010/0219848 A1 | 9/2010 | Gotoh et al. | |
| 2010/0259283 A1 * | 10/2010 | Togura | H03K 17/955 324/679 |

FOREIGN PATENT DOCUMENTS

| | | |
|---|---|---|
| JP | H08-62266 A | 3/1996 |
| JP | 2003-156524 A | 5/2003 |
| JP | 2007-078648 A | 3/2007 |
| JP | 2008-064742 A | 3/2008 |
| JP | 2009-115635 A | 5/2009 |
| JP | 2011-107086 A | 6/2011 |

* cited by examiner

FIG. 6

CAPACITANCE DETECTION CIRCUIT

TECHNICAL FIELD

The present invention relates to a capacitance detection circuit for detecting a change in capacitance between a pair of electrodes of a physical quantity sensor, with these electrodes generating the change in capacitance in response to a change in physical quantity.

BACKGROUND ART

An acceleration sensor, a gyroscope, a displacement sensor, a pressure sensor, or other type of physical sensor for detecting a physical change as a capacitance change, is required to reduce circuit noise when a capacitance detection circuit thereof needs to have a high resolution or when a MEMS (Micro Electro Mechanical System) sensor needs to be combined with the capacitance detection circuit in order to achieve cost/size reduction.

As such a capacitance detection circuit, there is known, for example, a capacitance detection circuit in which a sensor drive circuit applies drive voltage to a capacitance sensor element, a change in capacitance of the sensor element is converted into a voltage signal by a continuous-time C-V conversion circuit, a synchronous detecting circuit detects a signal component from a voltage signal obtained as a result of the conversion, and a smoothing circuit smoothes an output signal of the synchronous detecting circuit (see Patent Document 1, for example).

Patent Document 1: Japanese Patent Application Publication No. 2011-107086

Incidentally, the prior art described in Patent Document 1 is capable of accurately obtaining a detected output as an analog signal even when the capacitance changes continuously and slightly in response to a quantity change. When obtaining a detected output as an analog signal, the sensor drive circuit supplies sensor drive signals to a detection capacitor (capacitance Cs) and a reference capacitor (capacitance Cr), wherein the sensor drive signal is inverted in phase in order to be supplied to the reference capacitor (capacitance Cr). The sensor drive signal supplied to the detection capacitor (capacitance Cs) and the sensor drive signal supplied to the reference capacitor (capacitance Cr) are added up, and the difference therebetween is supplied to a charge amplifier.

SUMMARY

The problem with the prior art is that the capacitance Cr of the reference capacitor needs to be conformed to the capacitance Cs of the detection capacitor, but the capacitance Cr of the reference capacitor cannot be reduced in order to reduce a noise gain.

The present invention was contrived in view of the unsolved problem of the prior art, and an object of the present invention, therefore, is to provide a capacitance detection circuit that is capable of reliably reducing noise and detecting a small capacitance.

In order to achieve the object described above, a first aspect of the capacitance detection circuit according to the present invention is a capacitance detection circuit for detecting a change in capacitance between a pair of electrodes of a physical quantity sensor, the pair of electrodes generating the change in capacitance in response to a change in physical quantity. This capacitance detection circuit has a carrier signal generating circuit that supplies a carrier signal to one of the electrodes, and an operational amplifier that has an inverting input terminal to which the other one of the electrodes is input. The capacitance detection circuit also has a dummy capacity connected in parallel to the pair of electrodes, and a carrier signal conditioning circuit that inverts a phase of a carrier signal supplied from the carrier signal generating circuit to the dummy capacity, and adjusts a gain to inhibit the dummy capacity.

The capacitance detection circuit according to the present invention further has a demodulating circuit which is connected to an output side of the operational amplifier and to which a carrier signal of the carrier signal generating circuit is input, a low pass filter that smoothes a demodulated output of the demodulating circuit, and an A/D conversion circuit that converts a filter output of the low pass filter to a digital signal. The carrier signal conditioning circuit has an offset adjuster that adjusts a zero offset of the A/D conversion circuit.

In the capacitance detection circuit according to the present invention, the dummy capacity is formed on a printed circuit board mounted with the operational amplifier.

In addition, in the capacitance detection circuit according to the present invention, one terminal of the pair of the electrodes and a series circuit of the dummy capacity and carrier signal conditioning circuit are connected in parallel to an inverting input terminal of the operational amplifier, and an inverting input terminal is imaginary-shorted to the ground by connecting a non-inverting input side of the operational amplifier to the ground.

According to the present invention, due to the presence of the carrier signal conditioning circuit in the capacitance detection circuit, the carrier signal conditioning circuit inverting the phase of a carrier signal supplied from the carrier signal generating circuit to the dummy capacity and adjusting a gain to control the dummy capacity, the amplification factor of the carrier signal can be increased and the dummy capacity can be reduced, reducing noise gain and inhibiting noise.

Furthermore, the carrier signal conditioning circuit can adjust the zero offset of the A/D conversion circuit when the demodulating circuit demodulates the output of the operational amplifier and when the demodulated output is denoised by the low pass filter and subjected to A/D conversion. In this manner, an SN ratio of the A/D conversion circuit can be improved.

BRIEF DESCRIPTION OF THE DRAWINGS

FIGS. 1A and 1B are schematic diagrams showing an acceleration sensor to which the present invention can be applied, wherein

DETAILED DESCRIPTION

An embodiment of the present invention is described hereinafter with reference to the drawings.

Figure 1A:
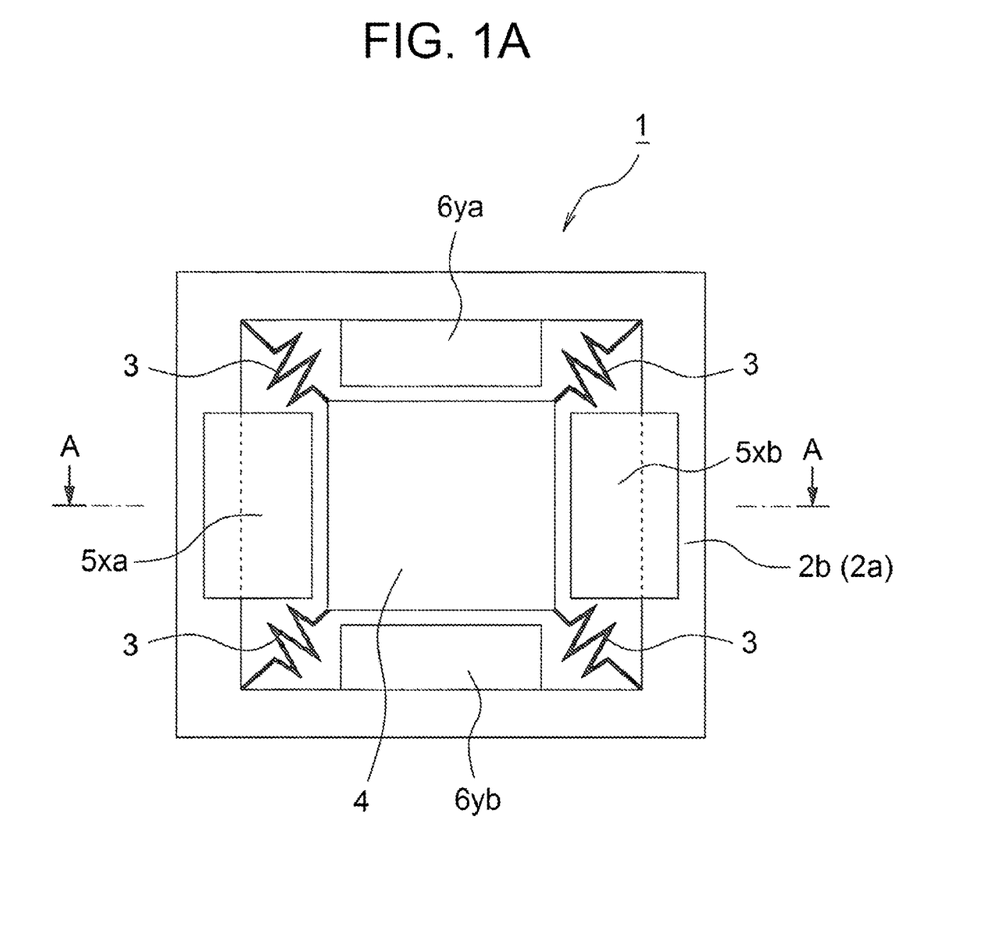
FIG. 1A is a plan view and FIG. 1B is a cross-sectional diagram taken along the line A-A of FIG. 1A.
Figure 1B:
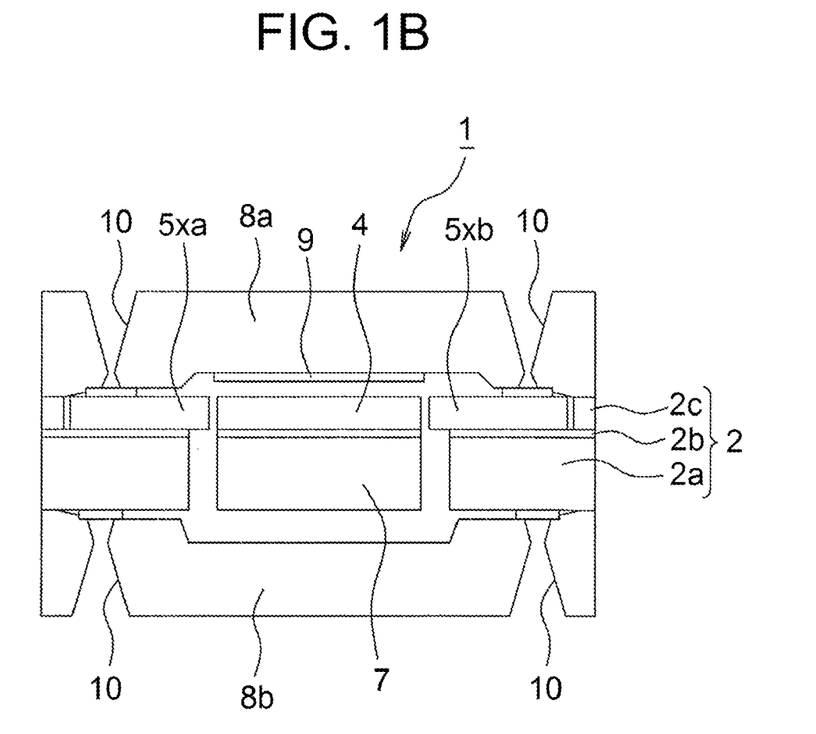

FIGS. 1A and 1B are schematic diagrams showing an example of an acceleration sensor to which a capacitance detection circuit according to the present invention can be applied. FIG. 1A is a plan view showing the acceleration sensor without an upper substrate. FIG. 1B is a cross-sectional diagram taken along the line A-A of FIG. 1A.

In the diagram, reference numeral 1 represents an acceleration sensor. This acceleration sensor 1 is configured by an SOI (Silicon On Insulator) substrate 2. The SOI substrate 2 is configured by a silicon support layer 2a forming an underlayer of the SOI substrate 2, an oxide silicon layer 2b formed on the silicon support layer 2a, and a silicon active layer 2c formed on the oxide silicon layer 2b.

The silicon support layer 2a and the oxide silicon layer 2b have a weight 7, described hereinafter, which has its outer circumferential portion formed into a square frame and its central portion dry-etched into a square groove.

The silicon active layer 2c has at its center a square movable electrode 4 that is supported at its corners on the oxide silicon layer 2b by spring materials 3, a pair of X-axis fixed electrodes 5Xa, 5Xb fixed to the oxide silicon layer 2b in such a manner as to face the two sides of the movable electrode 4 that extend in an X-direction, and a pair of Y-axis fixed electrodes 6Ya, 6Yb fixed to the oxide silicon layer 2b in such a manner as to face the two sides of the movable electrode 4 that extend in a Y-direction. On the upper surface of the movable electrode, the weight 7 is provided.

Furthermore, the upper and lower sides of the SOI substrate 2 are covered with glass substrates 8a and 8b respectively. A Z-axis fixed electrode 9 is formed on the glass substrate 8a in such a manner as to face the movable electrode 4. Through-holes 10 are formed in these glass substrates 8a and 8b in order to extract signals of the X-axis fixed electrodes 5Xa, 5Xb, the Y-axis fixed electrodes 6Ya, 6Yb, the movable electrode 4, and the Z-axis fixed electrode 9 to the outside.

In X direction of the acceleration sensor 1, therefore, capacitances Cxa and Cxb between the movable electrode 4 and the pair of left and right fixed electrodes 5Xa and 5Xb form a differential structure having a horizontally symmetric correlation where one of the capacitances increases while the other decreases. Similarly, in the Y direction, capacitances Cya and Cyb between the movable electrode 4 and the pair of front and rear fixed electrodes 6Ya and 6Yb form a differential structure having a vertically symmetric correlation where one of the capacitances increases while the other decreases.

In a Z direction of the acceleration sensor 1, however, due to the presence of the weight 7 formed on a lower surface of the movable electrode 4, an asymmetric structure is formed only by a capacitance Cz between the movable electrode 4 and the Z-axis fixed electrode 9 facing the movable electrode 4 from above.

When an acceleration is applied to the acceleration sensor 1, the movable electrode 4 supporting the weight 7 moves in the XYZ direction in accordance with the direction of this acceleration. Consequently, the capacitances Cxa and Cxb in the X direction, the capacitances Cya and Cyb of the Y-axis direction, and the capacitance Cz in the Z-axis direction change. The acceleration applied can be measured using the changes in these capacitances.

Figure 2:
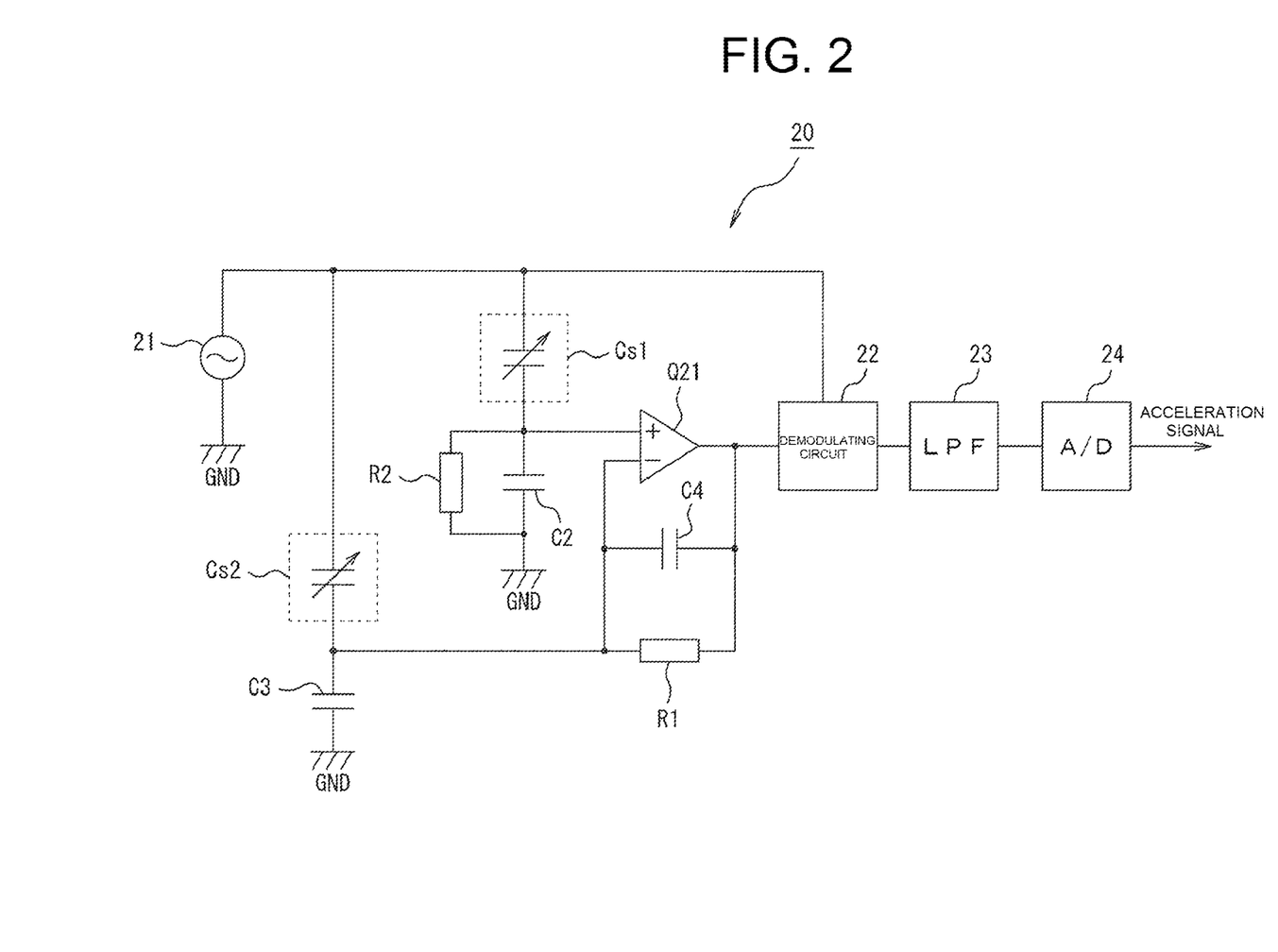
FIG. 2 is a circuit diagram showing a capacitance detection circuit in an XY direction.

In the symmetric structures in the X-axis direction and Y-axis direction, the capacitances can be detected by a capacitance detection circuit 20 shown in FIG. 2.

In other words, the capacitance Cxa or Cya is represented as a variable capacitance Cs1, and the capacitance Cxb or Cyb as a variable capacitance Cs2.

An electrode of either the variable capacitance Cs1 or Cs2 is connected to a carrier signal generating circuit 21 to supply a carrier signal. A carrier signal here is an AC waveform, such as a sine wave or square wave, having a frequency higher than that of the acceleration to be measured. Such a carrier signal is required to detect a capacitance from a low frequency of or approximately 0 Hz.

Capacitors C2 and C3 with the same capacitance are connected between an electrode of the other variable capacitance Cs1 or Cs2 and the ground, and a resistor R2 is connected in parallel to the capacitor C2. The capacitor C2 is provided for the purpose of swiftly charging the capacitance Cs1 with an electric charger, and the connection of capacitor C3 is implemented to maintain circuit balance. Generally, the capacity of the capacitor C2 is set to be equal to the capacity of the capacitor C3.

The connection point between the variable capacitance Cs1 and the capacitor C2 is connected to a non-inverting input terminal of a differential amplifier Q21, and the connection point between the variable capacitance Cs2 and the capacitor C3 is connected to an inverting input terminal of the differential amplifier Q21. An output terminal of the differential amplifier Q21 is fed back to the inverting input terminal via a parallel circuit of a resistor R1 and capacitor C4. In this state, the capacitor C4 determines a gain A1 of the differential amplifier Q21, the gain A1 being expressed as follows:

$$A1=(Cs1-Cs2)/C4 \qquad (1).$$

The resistors R1 and R2 are used for the purpose of stabilizing a DC potential of the differential amplifier Q21.

This differential amplifier Q21 outputs the difference between the variable capacitances Cs1 and Cs2. For instance, when an acceleration of "0" is applied to the acceleration sensor 1, the weight 7 is displaced by 0, and consequently the variable capacitance Cs1 becomes equal to the variable capacitance Cs2. As a result, the differential amplifier Q21 outputs a zero value.

When the acceleration is not "0," the weight 7 is displaced, and consequently the variable capacitances Cs1 and Cs2 become unequal to each other. As a result, the difference between these variable capacitances is output from the differential amplifier Q21. The greater the acceleration applied to the acceleration sensor 1, the greater the difference between the variable capacitances and therefore the greater the output from the differential amplifier Q21.

The output from the differential amplifier Q21 is supplied to a demodulating circuit 22 to which a carrier signal of the carrier signal generating circuit 21 has been input. The demodulating circuit 22 demodulates an output signal that is amplitude-modulated by the carrier signal obtained from the differential amplifier Q21.

The demodulated signal that is output from the demodulating circuit 22 is denoised with a low pass filter 23, which is then converted into a digital signal by an A/D conversion circuit 24 and output as an acceleration signal.

The capacitance detection circuit 20 shown in FIG. 2 can be applied when the variable capacitances Cs1 and Cs2 having the differential structures are obtained in the X-axis and Y-axis directions. However, when an acceleration in the Z-axis direction is applied, a capacitance detection circuit 30 shown in FIG. 3 is applied in place of the above-described capacitance detection circuit 20 shown in FIG. 2, because the asymmetric structure is formed.

Figure 3:
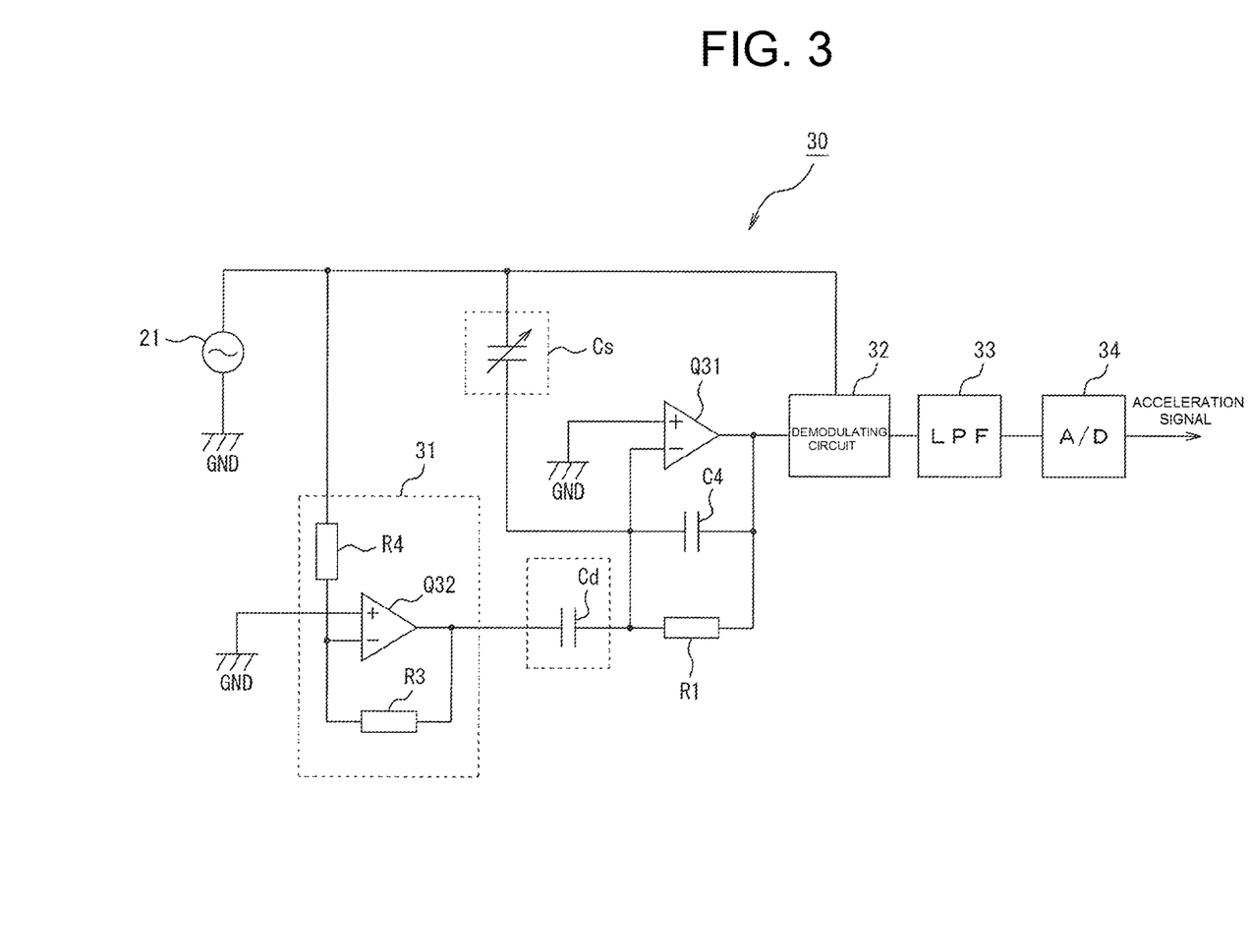
FIG. 3 is a circuit diagram showing the capacitance detection circuit in a Z direction.

In the capacitance detection circuit 30 shown in FIG. 3, a non-inverting input terminal of an operational amplifier Q31 corresponding to the differential amplifier Q21 shown in FIG. 2 is connected to the ground, and a variable capacitance Cs between the movable electrode 4 of the acceleration sensor 1 and the Z-axis fixed electrode 9 is connected to an inverting input terminal of the operational amplifier Q31. Further, the series circuit of a carrier signal conditioning circuit 31 and a dummy capacity Cd connects the dummy capacity Cd to the inverting input terminal of the operational amplifier Q31 in parallel with the variable capacitance Cs. The dummy capacity Cd does not need to be formed in the acceleration sensor 1 and can be disposed on a printed circuit board mounted with the capacitance detection circuit 30.

Furthermore, the carrier signal generating circuit 21 similar to the capacitance detection circuit 20 shown in FIG. 2 is connected to the other end of the variable capacitance Cs between the movable electrode 4 of the acceleration sensor 1 and the Z-axis fixed electrode 9 and to the input side of the carrier signal conditioning circuit 31.

The carrier signal conditioning circuit 31 here has an operational amplifier Q32 which has an inverting input terminal thereof connected to the carrier signal generating circuit 21 via a resistor R4 and a non-inverting input terminal of the same to the ground. The output side of the operational amplifier Q32 is connected to an inverting input terminal of the operational amplifier Q32 via a resistor R3, forming a negative feedback circuit.

In the carrier signal conditioning circuit 31, a non-inverting input terminal of the operational amplifier Q32 is connected to the ground and negatively fed back. Thus, an imaginary short occurs where a differential input voltage Vs between the inverting and non-inverting input terminals of the operational amplifier Q32 becomes approximately equal to 0.

In other words, when a voltage applied to the resistor R4 is represented as Vin, an output voltage of the operational amplifier Q32 as Vout, and an input current input through the resistor R4 as Ir1, this input current Ir1 is expressed as follows:

$$Ir1 \cong Vin/R4 \qquad (2).$$

Because no current flows to the input terminals of the operational amplifier Q32, a current Ir1 flowing to the feedback resistor R3 is expressed as follows:

$$Ir2 = Ir1 \cong Vin/R4 \qquad (3).$$

Therefore, an inter-terminal voltage Vr3 of the feedback resistor R3 is expressed as follows:

$$Vr3 = Ir2 \cdot R3 \cong (Vin/R4)R3 \qquad (4).$$

Consequently, the output voltage Vout of the operational amplifier Q32 is expressed as follows:

$$Vout \cong -Vr3 \cong -(R3/R4)Vin \qquad (5).$$

Thus, a gain A2 of the operational amplifier Q32 is expressed as follows:

$$A2 = Vout/Vin = -R3/R4 \qquad (6).$$

Hence, the operational amplifier Q32 is an inverting amplifier of the gain A2.

As a result, the carrier signal is inverted in phase and amplified by the carrier signal conditioning circuit 31, and the inverted amplified output of the carrier signal is supplied to the dummy capacity Cd.

A differential capacity (=Cs−Cd) is obtained by adding a carrier signal output from the dummy capacity Cd and a carrier signal output from the variable capacitance Cs, and this differential capacity is input to the inverting input terminal of the operational amplifier Q31.

In so doing, when the acceleration in the Z direction that is applied to the weight 7 of the acceleration sensor 1 is zero, the gain A2 of the operational amplifier Q32 of the carrier signal conditioning circuit 31 is adjusted in such a manner that the carrier signal output from the variable capacitance Cs and the carrier signal output from the dummy capacity Cd are balanced out to zero.

When the acceleration in the Z direction that is applied to the weight 7 of the acceleration sensor 1 is zero, the level of an input signal input to the inverting input terminal of the operational amplifier Q31 becomes zero, as well as an acceleration signal output from the A/D conversion circuit 34.

When an upward acceleration is applied to the weight 7 of the acceleration sensor 1, the variable capacitance Cs increases from the state in which the Z-direction acceleration is zero. As a result, the level of the input signal input to the inverting input terminal of the operational amplifier Q31 increases in a positive direction, while the output of the operational amplifier Q31 decreases in a negative direction. The output of the operational amplifier Q31 is demodulated by a demodulating circuit 32, which is then denoised by a low pass filter 33. The resultant signal is converted into a digital value by the A/D conversion circuit 34 and output as a Z-direction acceleration signal.

While on the other hand, when a downward acceleration is applied to the weight 7 of the acceleration sensor 1, the variable capacitance Cs decreases from the state in which the Z-direction acceleration is zero. As a result, the level of the input signal input to the inverting input terminal of the operational amplifier Q31 decreases in the negative direction, while the output of the operational amplifier Q31 increases in the positive direction. The output of the operational amplifier Q31 is demodulated by the demodulating circuit 32, which is then denoised by the low pass filter 33. The resultant signal is converted into a digital value by the A/D conversion circuit 34 and output as a Z-direction acceleration signal.

Figure 4:
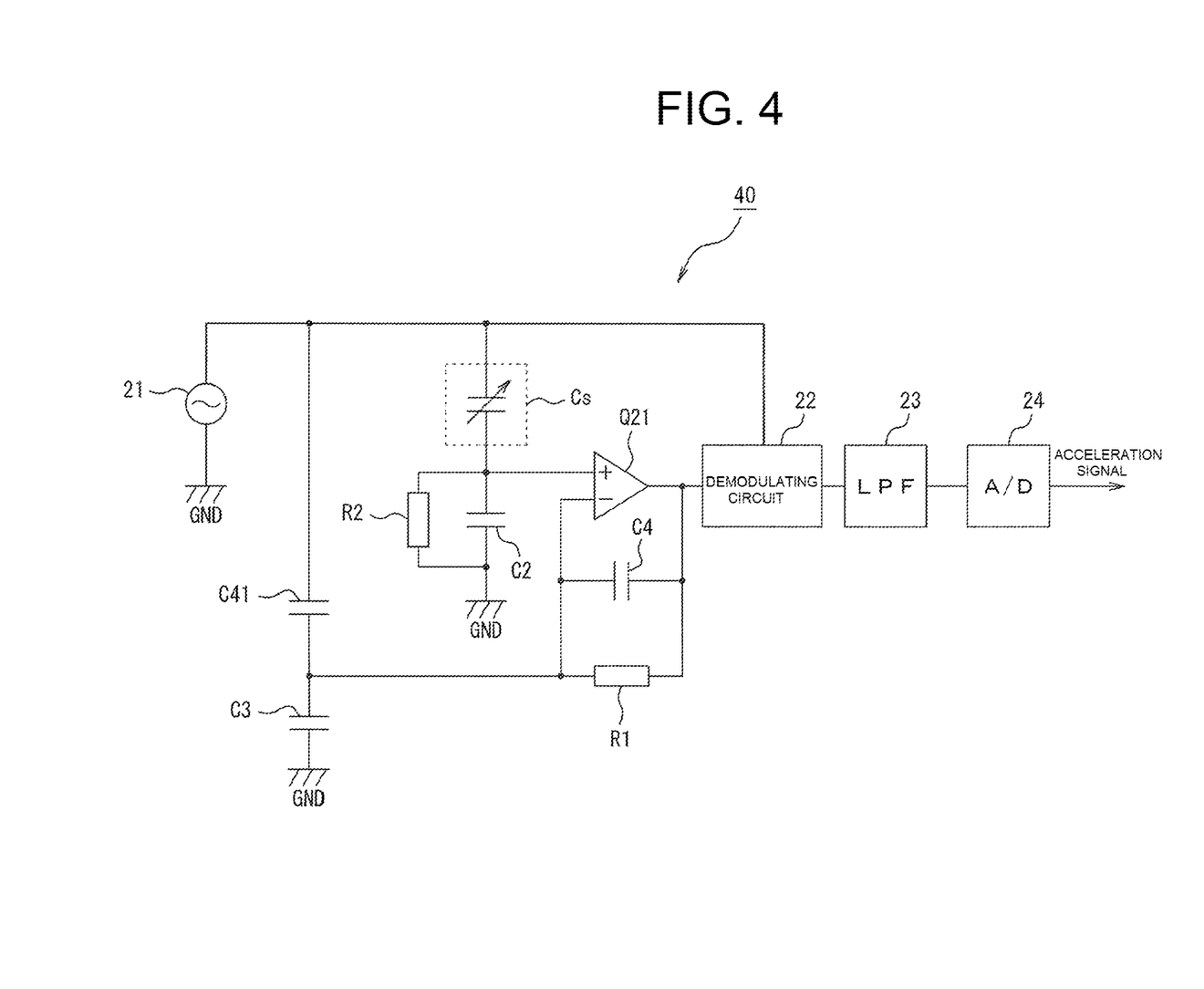
FIG. 4 is a circuit diagram showing a comparative example of the capacitance detection circuit in the Z direction.

A capacitance detection circuit 40 shown in FIG. 4 is now examined in comparison to the capacitance detection circuit 20 of FIG. 2 in order to explain the characteristics of the present embodiment illustrated in FIG. 3, the capacitance detection circuit 40 having the variable capacitance Cs2 substituted with a dummy capacity C41 of the same capacity as the variable capacity Cs2.

In this case, the acceleration sensor 1 generally has a greater spring constant in the Z direction of a sensor beam than in the X or Y direction due to the design complexity of the structure of the sensor beam. This is because the width of the beam as seen from above can be narrowed but the cross-sectional thickness thereof cannot be reduced as much as the aforementioned width in order to keep the strength of the entire weight. Generally, while the width of the beam perpendicular to a vibration direction is related to the first power of the spring constant, the thickness of the beam in the direction identical to the direction of vibration is related to the third power of the spring constant. Thus, the spring constant is greater in the direction of vibration (i.e., the Z-axis direction), which is the cross-sectional thickness direction, than in the X-axis or Y-axis direction.

Therefore, the rate of change in the capacitance in the Z-axis direction is smaller than that that in the X-axis or Y-axis direction. In this case, the following formula is established when the same acceleration is applied:

$$\Delta Cs/Cs < \Delta Cs1/Cs1 \quad (7),$$

where $\Delta Cs$ represents a change in capacity resulting from the Z-axis direction acceleration, and $\Delta Cs1$ a change in capacity in the X-axis or Y-axis direction acceleration.

Next, noise gain of an operational amplifier circuit that is generated by the differential amplifier Q21 is taken into consideration. Generally, the noise gain with respect to an equivalent input noise of the differential amplifier Q21 becomes as follows in the circuit shown in FIG. 2 and the circuit shown in FIG. 4, respectively: Gn2=(Cs1+C2)/C4, and Gn3=(Cs+C2)/C4. Generally the capacity of the capacitor C2 is substantially proportional to Cs and Cs1, and the capacity of the capacitor C4 is proportional to $\Delta Cs$ and $\Delta Cs1$. Thus, the following formulae are established:

$$(Cs1+C2)/C4 \propto Cs1/\Delta Cs1 \quad (8); \text{ and}$$

$$(Cs+C2)/C4 \propto Cs/\Delta Cs \quad (9).$$

Based on the formula (7), (8)<(9) is established, meaning that the noise gain in the Z-axis is greater than that of the X-axis or Y-axis. This brings about a problem that a Z-axis output noise from the acceleration becomes large.

In the present embodiment shown in FIG. 3, however, the dummy capacity Cd can be made lower than the capacity C2 shown in FIG. 4, by making the absolute value of the gain A2 of the operational amplifier Q32 be greater than Cs/C2 shown in FIG. 4.

In other words, the dummy capacity Cd can be set as follows:

$$Cd = Cs/A2 \quad (10).$$

When A2>Cs/C2, the dummy capacity Cd is set as follows:

$$Cd = Cs/A2 < Cs/(Cs/C2) = C2 \quad (11).$$

Consequently, a Z-axis noise gain Gn1 according to the present embodiment is calculated as follows:

$$Gn1 = (Cs+Cd)/C4 \quad (12).$$

As a result, the Z-axis noise gain Gn1 according to the present embodiment is smaller than the noise gain Gn3 calculated by the formula (9) shown in FIG. 4. In addition, the Z-axis noise gain calculated by the formula (12) according to the present embodiment can be set to be equal to the X-axis or Y-axis noise gain Gn2 calculated by the formula (8) by further increasing the gain A2 of the operational amplifier Q32.

According to the present embodiment, the configuration described above can be applied to the case where the operational amplifier Q31 has a linear input range. In case of the capacitance detection circuit 40 shown in FIG. 4, the following formula needs to be satisfied:

$$Vo \times Cs/(Cs+C2) < Vi \quad (13).$$

Where Vi represents a linear input range of the differential amplifier Q21 and Vo represents an output amplitude of the carrier signal generating circuit 21. The capacity C2 needs to be increased in order to satisfy the abovementioned formula.

The smaller the linear input range Vi of the differential amplifier Q21, the greater the capacity C2 needs to be. This results in an increase in the noise gain Gn3 expressed by the formula (9), bringing about a problem that the Z-axis output noise from the acceleration increases.

According to the present embodiment, however, because the non-inverting input terminal of the operational amplifier Q31 is connected to the ground, the inverting input terminal of the same is imaginary-shorted to the ground. Thus, the input signal level of the operational amplifier Q31 is kept within the linear operation range Vi. Even if the linear operation range of the operational amplifier Q31 is narrow, the input signal level can reliably be kept within the range. Therefore, the dummy capacity Cd (C2 of FIG. 4 corresponds to the dummy capacity Cd shown in FIG. 3) does not need to be increased despite the restriction shown in the formula (13), preventing the noise gain from increasing.

According to the present embodiment described above, the dummy capacity Cd does not have to be formed in the acceleration sensor 1 but can be loaded on the printed circuit board mounted with the capacitance detection circuit 30; thus, the configuration of the acceleration sensor 1 can be reduced in size.

Moreover, an imaginary short configuration is formed in the carrier signal conditioning circuit 31 by connecting the non-inverting input terminal of the operational amplifier Q32 to the ground and thereby forming a negative feedback circuit. As a result, the operational amplifier Q32 can be configured as an inverting amplifier having the gain A2 equal to R3/R4, and the dummy capacity Cd can be set at a small value by adjusting the gain A2. Thus, reducing the Z-axis noise gain Gn1 enables highly accurate capacitance detection.

Because the imaginary short configuration is obtained by connecting the non-inverting input terminal of the operational amplifier Q31 to the ground and forming the negative feedback circuit, the inverting input terminal of the operational amplifier Q31 is connected to the ground, and the input signal level of the operational amplifier Q1 can be kept within the linear operation range even when the linear input range Vi is narrow. For this reason, it is not necessary to increase the dummy capacity Cd in order to keep the input signal level within the linear input range Vi, reliably preventing the noise gain from increasing and the Z output noise of the acceleration from increasing.

Figure 5:
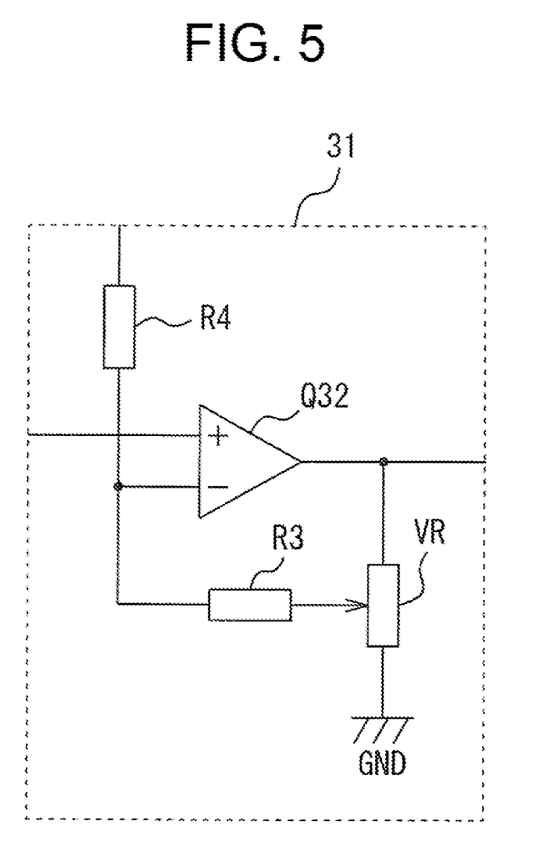
FIG. 5 is a circuit diagram showing a modification of an inverting amplifier circuit of FIG. 3.

Note that the aforementioned embodiment has described that the gain A2 of the operational amplifier Q32 of the carrier signal conditioning circuit 31 is determined based on the resistors R3 and R4; however, the present invention is not limited thereto. In other words, a variable resistor VR can be interposed between the output side of the operational amplifier Q32 and the ground, and the resistor R3 can be connected to a sliding terminal of the variable resistor VR, as shown in FIG. 5. As a result, with a resistance value of the variable resistor VR set as R5, the gain A2 of the operational amplifier Q32 can be calculated as follows: A2=(R3+R5)/R4. The gain A2 can be adjusted to any value by adjusting the resistance value R5 of the variable resistor VR. Consequently, the difference between the dummy capacity Cd and the capacitance Cs can be finely adjusted based on the relationship shown in the formula (10).

Furthermore, the output of the operational amplifier Q31 can easily be adjusted to zero when the acceleration is "0." Consequently, with effective use of an input range of the A/D conversion circuit 34 connected to the output side of the low pass filter 23, an SN ratio of the A/D conversion circuit 34 can be improved.

In other words, the SN ratio of the A/D conversion circuit 34 is expressed as follows: (Vrange−Zof)/Nadc, where Nadc represents noise of the A/D conversion circuit 34, and Zof represents zero offset of the A/D conversion circuit 34.

Therefore, by adjusting the gain of the carrier signal conditioning circuit 31 and the output of the operational amplifier Q31, the zero offset Zof the A/D conversion circuit 34 can be reduced, resulting in an increase of the SN ratio of the A/D conversion circuit 34.

Figure 6:
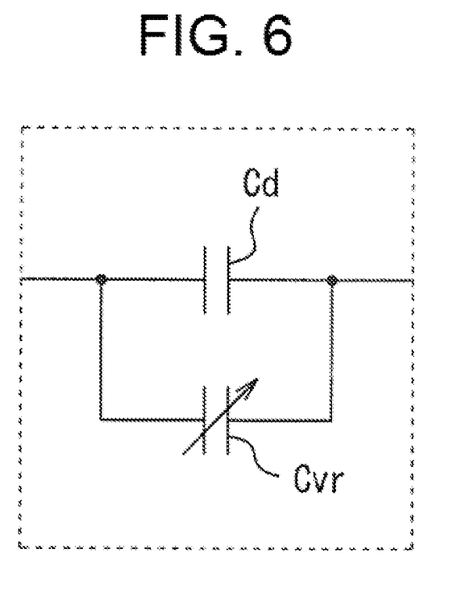
FIG. 6 is a circuit diagram showing a conditioning circuit for conditioning a dummy capacity.

Although FIG. 5 illustrates how the gain A2 of the carrier signal conditioning circuit 31 is adjusted and the difference between the dummy capacity Cd and the capacitance Cs is finely adjusted, the present invention is not limited to this configuration. The same operation effects as those obtained by the configuration shown in FIG. 5 can be achieved by connecting a variable capacity Cvr in parallel to the dummy capacity Cd and adjusting the combined capacity of the dummy capacity Cd and the variable capacity Cvr, as shown in FIG. 6.

INDUSTRIAL APPLICABILITY

The present invention can provide a capacitance detection circuit capable of reducing noise and accurately detecting a very small capacitance.

EXPLANATION OF REFERENCE NUMERALS

1 . . . Acceleration sensor, 3 . . . Plate spring material, 4 . . . Movable electrode, 5xa, 5xb . . . X-direction fixed electrode, 6ya, 6yb . . . Y-direction fixed electrode, 7 . . . Weight, 9 . . . Z-direction fixed electrode, 20 . . . Capacitance detection circuit, 21 . . . Carrier signal generating circuit, Cs1, Cs2 . . . Variable capacitance, C2 to C4 . . . Capacitor, R1, R2 . . . Resistor, Q21 . . . Differential amplifier, 22 . . . Demodulating circuit, 23 . . . Low pass filter, 24 . . . A/D conversion circuit, 30 . . . Capacitance detection circuit, 31 . . . Carrier signal conditioning circuit, 32 . . . Demodulating circuit, 33 . . . Low pass filter, 34 . . . A/D conversion circuit, Q31, Q32 . . . Operational amplifier, Cs . . . Variable capacitance, Cd . . . Dummy capacity, R3, R4 . . . Resistor, VR . . . Variable resistor, Cvr . . . Variable capacity

The invention claimed is:

1. A capacitance detection circuit for detecting a change in capacitance between a pair of electrodes of a physical quantity sensor, the pair of electrodes generating the change in capacitance in response to a change in a physical quantity, the capacitance detection circuit comprising:
   a carrier signal generating circuit that supplies a carrier signal to one of the electrodes;
   an operational amplifier that has an inverting input terminal to which another one of the electrodes is input;
   a dummy capacity that is connected in parallel to the pair of electrodes; and
   a carrier signal conditioning circuit that inverts a phase of a carrier signal supplied from the carrier signal generating circuit to the dummy capacity, and adjusts a gain to inhibit the dummy capacity.

2. The capacitance detection circuit according to claim 1, wherein the carrier signal conditioning circuit is configured by an inverting amplifier that has an inverting input terminal connected to the carrier signal generating circuit via a first resistor, a non-inverting input terminal connected to ground, and an output fed back to the inverting input terminal via a second resistor.

3. The capacitance detection circuit according to claim 2, wherein the dummy capacity is formed on a printed circuit board mounted with the operational amplifier.

4. The capacitance detection circuit according to claim 2, wherein one terminal of the pair of the electrodes and a series circuit of the dummy capacity and carrier signal conditioning circuit are connected in parallel to an inverting input terminal of the operational amplifier, and an inverting input terminal is imaginary-shorted to the ground by connecting a non-inverting input side of the operational amplifier to the ground.

5. The capacitance detection circuit according to claim 1, further comprising:
   a demodulating circuit which is connected to an output side of the operational amplifier and to which a carrier signal of the carrier signal generating circuit is input;
   a low pass filter that smoothes a demodulated output of the demodulating circuit; and
   an A/D conversion circuit that converts a filtered output of the low pass filter to a digital signal, wherein
   the carrier signal conditioning circuit has an offset adjuster that adjusts a zero offset of the A/D conversion circuit.

6. The capacitance detection circuit according to claim 5, wherein the dummy capacity is formed on a printed circuit board mounted with the operational amplifier.

7. The capacitance detection circuit according to claim 5, wherein one terminal of the pair of the electrodes and a series circuit of the dummy capacity and carrier signal conditioning circuit are connected in parallel to an inverting input terminal of the operational amplifier, and an inverting input terminal is imaginary-shorted to the ground by connecting a non-inverting input side of the operational amplifier to the ground.

8. The capacitance detection circuit according to claim 1, wherein the dummy capacity is formed on a printed circuit board mounted with the operational amplifier.

9. The capacitance detection circuit according to claim 8, wherein one terminal of the pair of the electrodes and a series circuit of the dummy capacity and carrier signal conditioning circuit are connected in parallel to an inverting input terminal of the operational amplifier, and an inverting input terminal is imaginary-shorted to the ground by connecting a non-inverting input side of the operational amplifier to the ground.

10. The capacitance detection circuit according to claim 1, wherein one terminal of the pair of the electrodes and a series circuit of the dummy capacity and carrier signal conditioning circuit are connected in parallel to an inverting input terminal of the operational amplifier, and an inverting input terminal is imaginary-shorted to the ground by connecting a non-inverting input side of the operational amplifier to the ground.

* * * * *